United States Patent [19]
Tomura et al.

[11] Patent Number: 5,485,949
[45] Date of Patent: Jan. 23, 1996

[54] CAPILLARY FOR A WIRE BONDING APPARATUS AND A METHOD FOR FORMING AN ELECTRIC CONNECTION BUMP USING THE CAPILLARY

[75] Inventors: Yoshihiro Tomura, Hirakata; Yoshihiro Bessho, Higashiosaka, both of Japan

[73] Assignee: Matsushita Electric Industrial Co., Ltd., Kadoma, Japan

[21] Appl. No.: 233,829

[22] Filed: Apr. 26, 1994

[30] Foreign Application Priority Data

Apr. 30, 1993 [JP] Japan .................................. 5-103848
Jun. 8, 1993 [JP] Japan .................................. 5-137090

[51] Int. Cl.$^6$ .................................................. H01L 21/603
[52] U.S. Cl. ........................................ 228/180.5; 228/4.5
[58] Field of Search ................................ 228/1.1, 4.5, 13, 228/180.5, 254; 156/73.2, 580.1, 580.2

[56] References Cited

U.S. PATENT DOCUMENTS

| | | | |
|---|---|---|---|
| 4,415,115 | 11/1983 | James .................................. | 228/4.5 |
| 5,172,851 | 12/1992 | Matsushita et al. ................. | 228/180.5 |
| 5,364,004 | 11/1994 | Davidson ............................. | 228/4.5 |

FOREIGN PATENT DOCUMENTS

| | | | |
|---|---|---|---|
| 0320244 | 6/1989 | European Pat. Off. . | |
| 128271 | 10/1979 | Japan ................................... | 228/4.5 |
| 130435 | 7/1984 | Japan ................................... | 228/4.5 |
| 96938 | 4/1989 | Japan ................................... | 228/4.5 |
| 250328 | 10/1990 | Japan ................................... | 228/4.5 |

OTHER PUBLICATIONS

Search Report for European Appl. 94106580.7, mailed Aug. 22, 1994.
"Tab Bumping Technique", (1992) Apr., No. 336, 2244 Research Disclosure.
"High Density I/O Pad Wire Ball Bonding Capillary Tool," (1987) May No. 277; 2244 Research Disclosure.

*Primary Examiner*—Samuel M. Heinrich
*Attorney, Agent, or Firm*—Renner, Otto, Boisselle & Sklar

[57] ABSTRACT

The capillary for ball bonding for forming a bump on the electrode pad of a semiconductor device includes a pressing member having a bore therein for supplying a metal wire, and a leveling member. The pressing member presses the ball-like end of the metal wire against the electrode pad in order to secure the ball-like end to the electrode pad under pressure. The leveling member makes the bump formed on the electrode pad to a predetermined height. According to the method of forming a bump using the capillary, first, a ball is formed at the end of the metal wire supplied from the bore. A first portion of the bump is formed by moving the capillary downwards and by securing the ball-like end to the electrode pad under pressure by the pressing member. A second portion of the bump is formed on the first portion by supplying the metal wire while the capillary is moved. When the capillary is moved downwards, a portion of the metal wire constituting the second portion is cut from the remaining portion of the metal wire in the bore by an edge of the pressing member, and simultaneously the bump is leveled by the leveling member.

19 Claims, 14 Drawing Sheets

CAPILLARY FOR A WIRE BONDING APPARATUS AND A METHOD FOR FORMING AN ELECTRIC CONNECTION BUMP USING THE CAPILLARY

BACKGROUND OF THE INVENTION

1. Field of the Invention

The present invention relates to an apparatus and a method for mounting a semiconductor device onto a circuit board, and more particularly to a capillary provided for a wire bonding apparatus and a method of forming electric connection contacts (bumps) which electrically connect electrode pads of the semiconductor device to terminal electrodes of the circuit board.

2. Description of the Related Art

Recently, the number of electrode pads per LSI chip has been increased, and the pitch of the connecting terminals has been shortened, thereby making conventional soldering methods difficult to use for mounting a semiconductor device.

In order to solve this problem, recently, improved methods have been proposed in which a semiconductor device such as an LSI chip, is directly mounted on input/output terminal electrodes of a circuit board. Among these improved methods, a flip chip bonding method in which a semiconductor device is mounted facedown on a circuit board is known to be effective because the semiconductor device is electrically connected to a large number of terminal electrodes of the circuit board at one time with the resulting connections having good mechanical strength. Bumps (projecting electrodes) which electrically connect the semiconductor device with electrode pads of the circuit board are formed by electrolytic plating, solder bath immersion, vapor deposition, ball bonding using wire bonding method, and the like.

For example, conventional typical capillaries for wire bonding apparatus are shown in the Bonding Handbook and the Capillary Catalog by MICRO-SWISS Co.

FIG. 19 shows an exemplary conventional capillary 100 for a wire bonding apparatus, and FIG. 20A is a schematic cross-sectional view showing a tip portion 110 of the capillary 100. FIG. 20B shows the shape of the tip portion 110 of the capillary 100 in more detail.

As is shown in FIG. 20A, in the cylindrical capillary 100, there is provided a bore 102 into which a metal wire for bonding is inserted. The diameter of the bore 102 is in the range of about 25 μm to 50 μm. The tip portion 110 of the capillary 100 has a cone shape with an angle $\alpha$ of about 30°, in view of the bonding pitch, and the shape and size of the metal wire (or a bump) after the bonding.

FIG. 20B, for example, shows the shape of the tip portion 110 of the capillary 100 when a metal wire having a diameter of about 25 μm is used. In this case, the bore diameter (hole diameter) H is 38 μm, the tip diameter T is 203 μm, and the chamfer diameter CD is 74 μm. By using a capillary 100 having such a shape, it is possible to form bumps on electrode pads of a semiconductor device and to realize the electric connection to terminal electrodes of circuit board. The capillary shown in FIGS. 20A and 20B is usually used for the bonding with a bonding pitch of 140 μm or more.

FIGS. 21, 22A, and 22B show another exemplary conventional capillary 200 for a wire bonding apparatus. The capillary 200 is usually used for the bonding with a bonding pitch less than 140 μm. As is shown in FIG. 21, the end portion of the cylindrical capillary 200 has a bottleneck 210 for the narrower bonding pitch. The height NH of the bottleneck is usually about 500 μm. In the example shown in FIG. 22A, the height NH is 460 μm. In the capillary 200, there is provided a bore 102 into which a metal wire for bonding is inserted, the same as in the capillary 100. The diameter of the bore 102 is in the range of about 25 μm to 50 m. The bottleneck 210 of the capillary 200 has a cone shape with an angle $\beta$ of about 10°, in view of the bonding pitch and the shape and size of the metal wire (or a bump) after the bonding.

FIG. 22B, for example, shows the shape of the end portion of the capillary 200 when a metal wire having a diameter of about 25 μm is used. In this case, the bore diameter (hole diameter) H is 38 μm, the tip diameter T is 152 μm, and the chamfer diameter CD is 64 μm. By using a capillary 200 having such a shape, it is possible to form bumps on electrode pads of a semiconductor device and to realize the electric connection to terminal electrodes of circuit board.

Next, a conventional method of forming bumps of a semiconductor device by ball bonding will be described using the above-described capillary for wire bonding. For example, Japanese Laid-Open Patent Publication No. 2-34949 shows electric contact bumps each having a two-stage projecting shape (hereinafter, referred to as two-stage bumps), and a method of forming such two-stage bumps using a conventional capillary.

FIGS. 23A to 23D schematically show a method of forming a two-stage bump 107 on an electrode pad 103 which is formed on an IC chip 106, using a capillary 101 by conventional ball bonding.

First, as is shown in FIG. 23A, a metal wire 104 having a diameter of 25 μm is inserted into a bore 102 of the capillary 101. Thermal energy is applied to the end of the metal wire 104 by a gas flame, electric pulses, ultrasonic vibration, or the like. As a result, a ball 105 having a diameter which is about two or three times as large as the diameter of the metal wire 104 is formed at the end of the metal wire 104.

Next, as is shown in FIG. 23B, the ball 105 formed at the end of the metal wire 104 is caused to abut against the electrode pad 103 of the IC chip 106 by moving the capillary 101 downwards. By thermo-compression bonding, or by the application of ultrasonic vibration, the ball 105 is secured to the electrode pad 103, so as to form a pedestal portion 109 of the bump 107 (the first bonding step). The pedestal portion 109 has an outer diameter of about 80 μm to 90 μm, and a height of about 20 μm to 30 μm.

Then, as is shown in FIG. 23C, under the condition that the pedestal portion 109 of the bump 107 and the metal wire 104 inserted in the bore 102 of the capillary 101 are connected, the capillary 101 is moved in a loop. Specifically, the capillary 101 is first moved upwards above the pedestal portion 109 of the bump 107, and then moved in a loop. Thereafter, while the capillary 101 is moved downwards, the metal wire 104 is cut (the second bonding, see FIG. 23D). As is shown in FIG. 23D, by the loop movement of the capillary 101, a ring-shaped or reversed U-shaped portion of the metal wire 104 is formed on the pedestal portion 109. The portion constitutes a top portion 108 of the bump 107. The metal wire 104 is cut by the edge 111 of the tip of the capillary 101. Thus, the formation of the two-stage bump 107 shown in FIG. 24 is completed.

Each of the pressures for the first bonding and the second bonding is set in the range of 20 g to 45 g per one bump, depending on the material of the wire and the wire diameter.

FIG. 24 shows the shape of a typical two-stage bump formed by conventional ball bonding. The two-stage bump 107 (stud bump) has an outer diameter R of about 80 μm to 90 μm, and a total height $h_1$ of about 60 μm to 80 μm.

In order to make the heights of the two-stage bumps 107 uniform, a leveling process in which the bumps 107 are pressed against a smooth plane is performed (see FIG. 25). The reason why the leveling process is required is that the heights of the bumps formed by ball bonding are largely different from each other, as compared with the heights of bumps formed by other methods. In cases where conductive adhesive is used as an adhesion layer for connecting a semiconductor device to a circuit board, the leveling process can attain another effect in that the transfer amount of the conductive adhesive is stabilized.

As is shown in FIG. 25, in the leveling process, the IC chip 106 is disposed facedown and pressed against the smooth plane 112. The leveling load is generally about 50 g per one bump. The leveling load is adjusted depending on the material of the wire and the wire diameter. FIG. 26 shows a typical shape of the two-stage bump 107 after the leveling process. As the result of the leveling, the total heights $h_1$ of the two-stage bumps 107 are uniformly set in the range of 40 μm to 50 μm.

The conventional capillary and the conventional bump forming method as described above require a process for forming bumps on a semiconductor device and another process for leveling the formed bumps, which causes high production costs. Moreover, an apparatus for the leveling is additionally required.

However, the omission of the leveling process causes the following problems; first, the top portion 108 of the bump formed by ball bonding (before leveling process) is ring-shaped or reversed U-shaped, so that the top face 113 of the top portion 108 has a small area (see FIG. 24). This means that the contact area with a terminal electrode of the circuit board is disadvantageously small. In addition, the heights of respective bumps are usually varied, so that the bumps without leveling cannot realize the connection with the desired high reliability. Secondly, in the case where the conductive adhesive is used as the adhesion layer, due to the shape of the bumps before the leveling, only small amounts of conductive adhesive can be transferred to the top ends of the bumps, and the transferred amounts are largely varied. Accordingly, the adhesion strength after the curing of the conductive adhesive is low, and hence the adhesion reliability is low. Further, the connection resistance is increased. For these reasons, it is preferred not to omit the leveling process.

Furthermore, by the conventional bump forming method as described above, the bumps may be formed into other shapes as shown in FIGS. 27A to 27C rather than the typical shape shown in FIG. 24. The shapes of the bumps shown in FIGS. 27A and 27B are referred to as "second peeling". That is, when the metal wire 104 is cut by the capillary 101, the end 114 of the ring-shaped or reverse U-shaped portion is peeled from the body of the bump 107. The shape of the bump shown in FIG. 27C is referred to as "tail standing". If a projecting portion of the tail 115 measured from the side of the bump is larger than the quarter of the diameter of the bump pedestal portion, the bump is defective. Such a defective bump occurs when the metal wire 104 is not cut well at a predetermined position by the edge 111 of the capillary 101. The bumps having these shapes are undesirable as connecting contacts. In the bump shown in FIG. 27A, the top portion 116 is separated into two portions, so that sufficient strength cannot be obtained. In the bump shown in FIG. 27C, the tail 115 is projected sideways. If the conductive adhesive is held at the tail 115 and then spread, the risk of the occurrence of a short-circuit with adjacent bumps and electrodes becomes very high. As described above, the bumps of these undesired shapes may cause connection failure and a short-circuit, so that it becomes difficult to connect the semiconductor device to the circuit board with high reliability by using such bumps.

FIGS. 28A and 28B show shapes of other kinds of defective bumps, which are caused by the conventional leveling process. In these bumps, the top portions thereof are undesirably fallen sidewards as the result of the leveling.

SUMMARY OF THE INVENTION

The capillary for ball bonding for forming a bump on the electrode pad of a semiconductor device, the capillary of this invention, includes: a pressing member for pressing a ball-like end of a metal wire against the electrode pad to secure the ball-like end to the electrode pad under pressure; a bore, provided in the pressing member, for supplying the metal wire; and a leveling member for making the bump formed on the electrode pad to a predetermined height.

In one embodiment of the invention, the leveling member is a protrusion projected from an outer circumference of the capillary.

In another embodiment of the invention, the leveling member is provided along an outer circumference of the capillary.

In another embodiment of the invention, the leveling member is provided in a portion of an outer circumference of the capillary.

In another embodiment of the invention, the pressing member includes a tip face of the capillary, and the leveling member includes a bottom face for pressing the bump. The leveling member may be provided so that the bottom face is positioned at a predetermined height measured from the tip face. The bottom face may have a rugged side. Also, the leveling member includes a guiding portion adjacent to the bottom face, the guiding portion being projected downwards from the bottom face.

In another embodiment of the invention, the pressing member has an edge for cutting the metal wire.

In another embodiment of the invention, the capillary is made of a material selected from the group consisting of ceramic and artificial ruby.

In another embodiment of the invention, the bottom face may be substantially parallel to a stage of a bonding apparatus to which the capillary is attached.

According to another aspect of the invention, a method of forming a bump on an electrode pad of a semiconductor device using a capillary for ball bonding is provided. The capillary includes: a pressing member including a tip face of the capillary; a bore, provided in the pressing member, for supplying the metal wire; and a leveling member provided on an outer circumference of the capillary. The method includes the steps of: (a) forming a ball at an end of the metal wire supplied from the bore; (b) forming a first portion of the bump by moving the capillary downwards and by securing the ball-like end to the electrode pad under pressure by the pressing member; (c) forming a second portion of the bump on the first portion by supplying the metal wire while the capillary is moved; and (d) when the capillary is moved downwards, cutting a portion of the metal wire constituting the second portion from the remaining portion of the metal wire in the bore by an edge of the pressing member, and simultaneously leveling the bump by the leveling member.

In one embodiment of the invention, in the step (c), the capillary is moved in a loop above the first portion, and the portion of the metal wire constituting the second portion of the bump is formed in a ring-shape or a reversed U-shape on the first portion.

In another embodiment of the invention, the leveling member includes a bottom face positioned at a predetermined height measured from the tip face, and in the step (d), the bump is formed to have the predetermined height by pressing the bump by the bottom face. Alternatively, in the step (d), the capillary is moved downwards until the tip face abuts against the electrode pad. Alternatively, the bottom pad has a rugged side, and in the step (d), the second portion of the bump is formed to have a rugged top face. Alternatively, the leveling member includes a guiding portion adjacent to the bottom face, the guiding portion being projected downwards from the bottom face, and in the step (d), the present portion of the bump is supported by the guiding portion.

In another embodiment of the invention, in the step (b), the first portion is formed by thermo-compression bonding.

In another embodiment of the invention, in the step (b), the first portion is formed by ultrasonic vibration.

In another embodiment of the invention, in the step (b), the first portion is formed by a combination of thermo-compression bonding and ultrasonic vibration.

In another embodiment of the invention, the metal wire is made of a material selected from the group consisting of Au, Cu, Al, and solder.

In the above steps (b), (c), and (d), the capillary is moved in a Z direction, and the stage of the bonding apparatus (bonder) is moved in an X-Y direction. By combining these movements, a desired two-stage bump (stud bump) may be formed.

Thus, the invention described herein makes possible the advantages of (1) providing a capillary for ball bonding by which bumps for connecting a semiconductor device to a circuit board with ease and with high reliability can be formed without an additional process, and a method of forming bumps using the capillary, and (2) providing a capillary for ball bonding by which the formation of bumps with undesirable shapes can be prevented and by which bumps with stable and uniform shapes can be formed, and a method of forming bumps using the capillary.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Example 1

Figure 1:
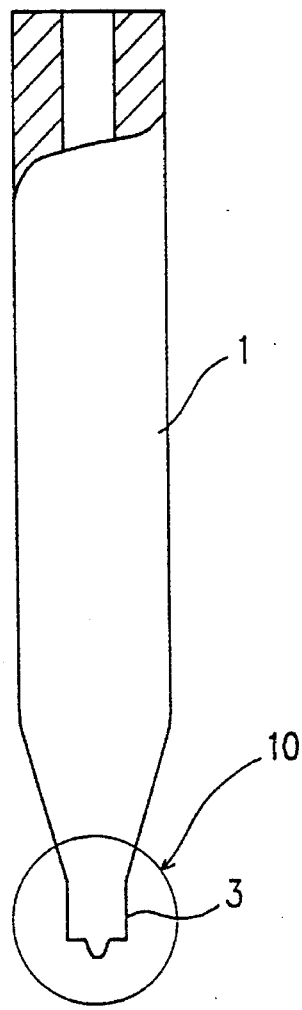
FIG. 1 is a diagram showing a capillary for ball bonding in a first example according to the invention.
Figure 2A:
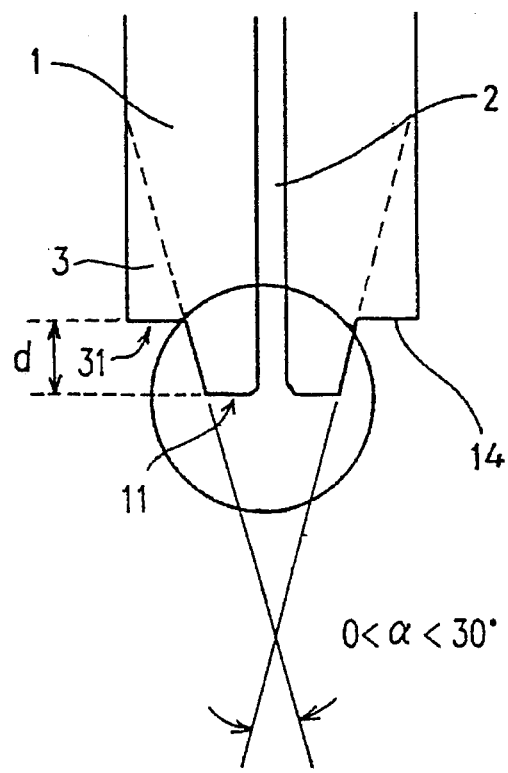
FIG. 2A is a schematic cross-sectional view of an end portion of a capillary shown in FIG. 1.
Figure 2B:
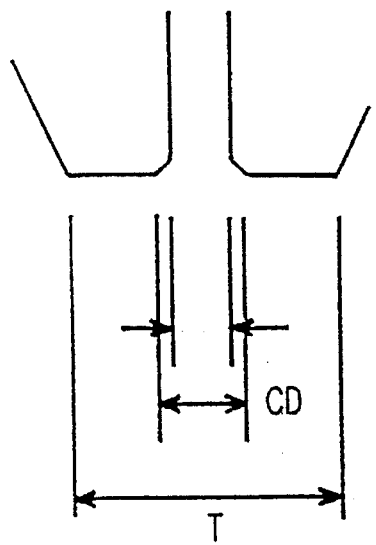
FIG. 2B is a diagram showing the shape of the end portion of the capillary in detail.

FIG. 1 shows a capillary 1 for ball bonding in a first example according to the invention. FIG. 2A is a schematic cross-sectional view of an end portion 10 of the capillary 1. FIG. 2B shows in more detail the shape of the end portion 10 of the capillary 1.

As is shown in FIG. 1, the cylindrical capillary 1 has a protrusion 3 as a leveling member provided on an outer circumference of the end portion 10. The capillary 1 is made of ceramic or artificial ruby. As is shown in FIG. 2A, a bottom face 31 (a leveling plane) of the protrusion 3 is substantially parallel to the tip face 11 of the capillary 1. A height measured from the tip face 11 of the capillary 1 to the bottom face 31 is set to a predetermined value d. The area of the bottom face 31 can be selected depending on the bonding pitch and the diameter of the top end of the bump to be leveled.

In the capillary 1, there is provided a bore 2 into which a metal wire for bonding is inserted. The diameter of the bore 2 is in the range of 25 μm to 50 μm. The end portion 10 of the capillary 1 has a cone shape with an angle α of about 10° to 30°, in view of the bonding pitch, and the shape and size of the metal wire (or a bump) after the bonding.

FIG. 2B, for example, shows the shape of the end portion 10 of the capillary 1 when a metal wire having a diameter of about 25 μm is used. In this case, the bore diameter (hole diameter) H is 38 μm, the tip diameter T is 203 μm, and the chamfer diameter CD is 74 μm.

Figure 3:
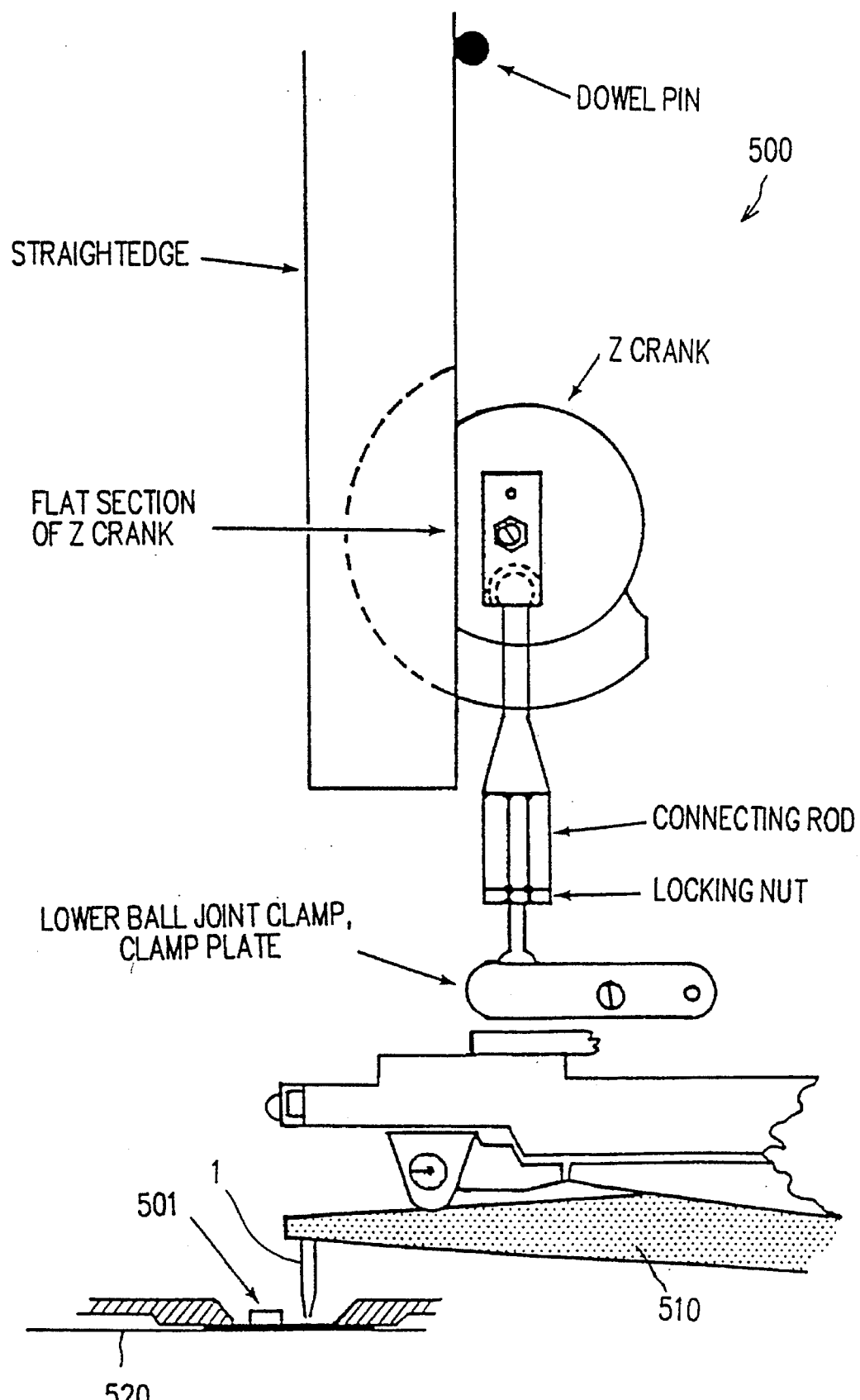
FIG. 3 shows an exemplary bonder to which a capillary of the invention is attached.

The above-described capillary 1 is, for example, attached to a bonder 500 shown in FIG. 3. In the bonder 500, the capillary 1 is attached to an end portion of an arm 510 which functions as an ultrasonic transmitting tool. A device (an IC chip) 501 to be subjected to the bonding is located on a bonding stage 520. The capillary 1 is moved upwards or downwards together with the arm 510. The device 501 is moved or rotated horizontally (in the X-Y direction) together with the bonding stage 520. By appropriately combining the vertical movement with the horizontal movement, the capillary 1 can be moved in a desirable direction and to a desirable position with respect to the device 501.

Next, a method of forming bumps on the semiconductor device by a ball bonding method using the capillary 1 in the first example is described.

FIGS. 4A to 4E schematically show a method of forming a two-stage bump 7 by a ball bonding method using the capillary 1 according to the invention, on an electrode pat 13 on an IC chip 6.

Figure 4A:
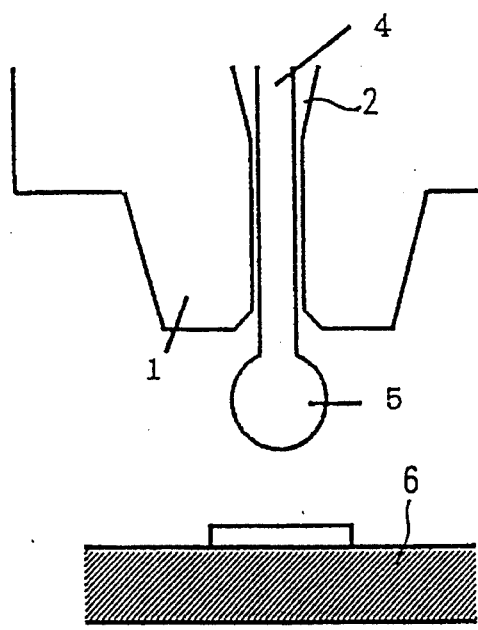
FIGs. 4A to 4E are diagrams schematically showing a method of forming two-stage bumps using the capillary of the invention.

First, as is shown in FIG. 4A, a metal wire 4 having a diameter of 25 μm is inserted into a bore 2 of the capillary 1. Thermal energy is applied to the end of the metal wire 4 by gas flame, electric pulses, ultrasonic vibration, or the like. As a result, a ball 5 having a diameter which is about two or three times as large as the diameter of the metal wire 4 is formed at the end of the metal wire 4.

The metal wire 4 can be made of a material to which the wire bonding method can be utilized, such as Au, Al, and Cu. The material and the diameter of the metal wire 4 can be selected depending on the outer diameter, the height, and the like of the bump 7 to be formed.

Figure 4B:
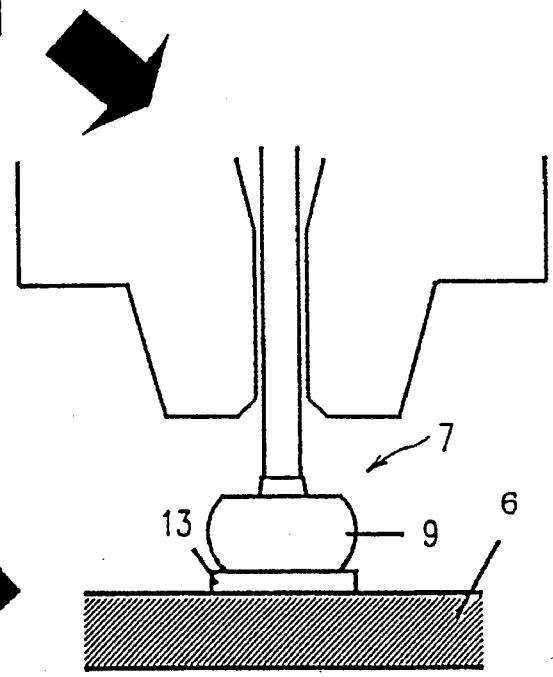

Next, as is shown in FIG. 4B, the ball 5 formed at the end of the metal wire 4 is caused to abut against the electrode pad 13 of the IC chip 6 by moving the capillary 1 downwards. By thermo-compression bonding, or by the application of ultrasonic vibration, the ball 5 is secured to the electrode pad 13, so as to form a pedestal portion 9 of the bump 7 (the first bonding step). The first bonding is performed with the tip face 11 of the capillary 1. The pedestal portion 9 has an outer diameter of about 80 μm to 90 μm, and a height of about 20 μm to 30 μm.

Figure 4C:
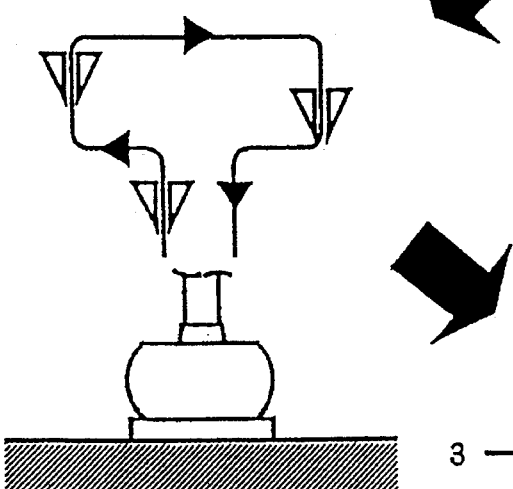
Figure 4D:
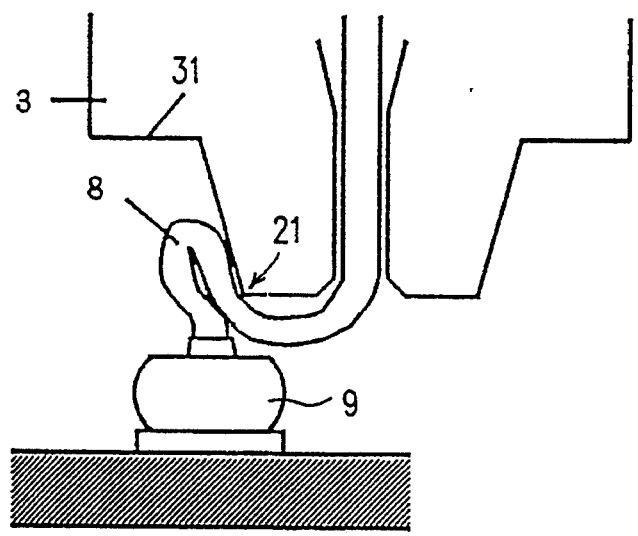

Then, as is shown in FIG. 4C, under the condition that the pedestal portion 9 of the bump 7 and the metal wire 4 inserted in the bore 2 of the capillary 1 are connected, the capillary 1 is moved in a loop with respect to the IC chip 6. Specifically, the capillary 1 is first moved upwards above the pedestal portion 9 of the bump 7, and then moved in a loop. As is shown in FIG. 4D, by the loop movement of the capillary 1 with respect to the IC chip 6, a ring-shaped or reversed U-shaped portion of the metal wire 4 is formed on the pedestal portion 9. The portion constitutes a top portion 8 of the bump 7. The height of the top portion 8 in this step is about 40 μm to 50 μm.

Figure 4E:
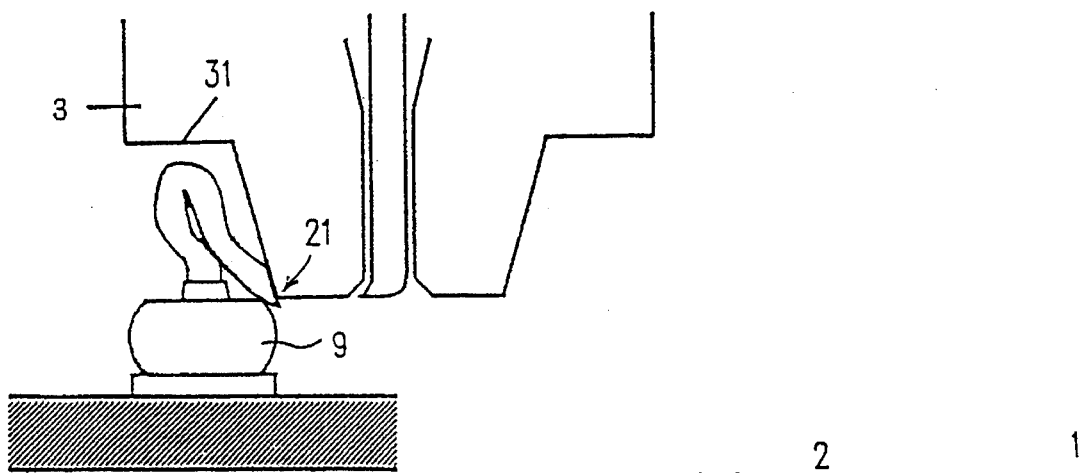
Figure 5:
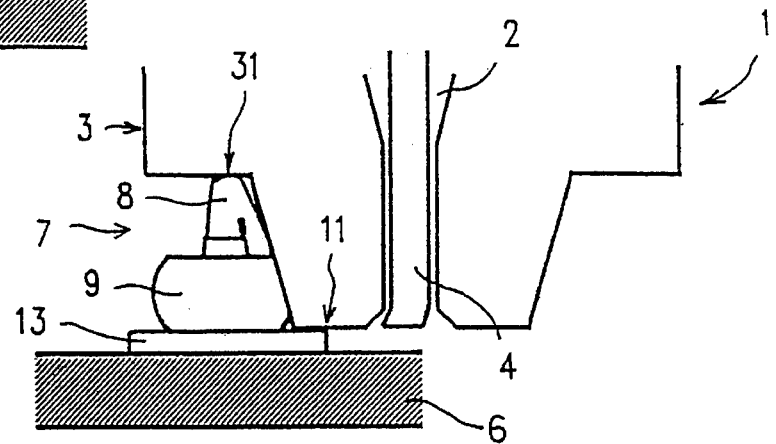
FIG. 5 is a diagram illustrating a process of pressing and shaping the bumps using the capillary of the invention.

Thereafter, the capillary 1 is moved in such a manner that an edge 21 of the end portion of the capillary 1 is positioned at the outer circumference of the pedestal portion 9 of the bump 7, and then the capillary 1 is moved downwards so as to cut the metal wire 4 by the edge 21 (FIG. 4E). The capillary 1 is moved further downwards, as is shown in FIG. 5, so that the bump 7 is pressed and shaped by the bottom face 31 of the protrusion 3 which is provided on the outer circumference of the capillary 1 (the second bonding step). In this process, the capillary 1 is moved downwards until the tip face 11 abuts against the electrode pad 13. The total height of the bump 7 is set to be substantially equal to the height difference between the tip face 11 of the capillary 1 and the bottom face 31 of the protrusion 3 (i.e., the predetermined value d), thereby performing the leveling.

The pressure for the first bonding can be set, for example, in the range of 25 g to 45 g per one bump, and the pressure for the second bonding can be set in the range of 70 g to 95 g per one bump. The pressures for bonding are adjusted depending on the material of the wire and the wire diameter.

Figure 6:
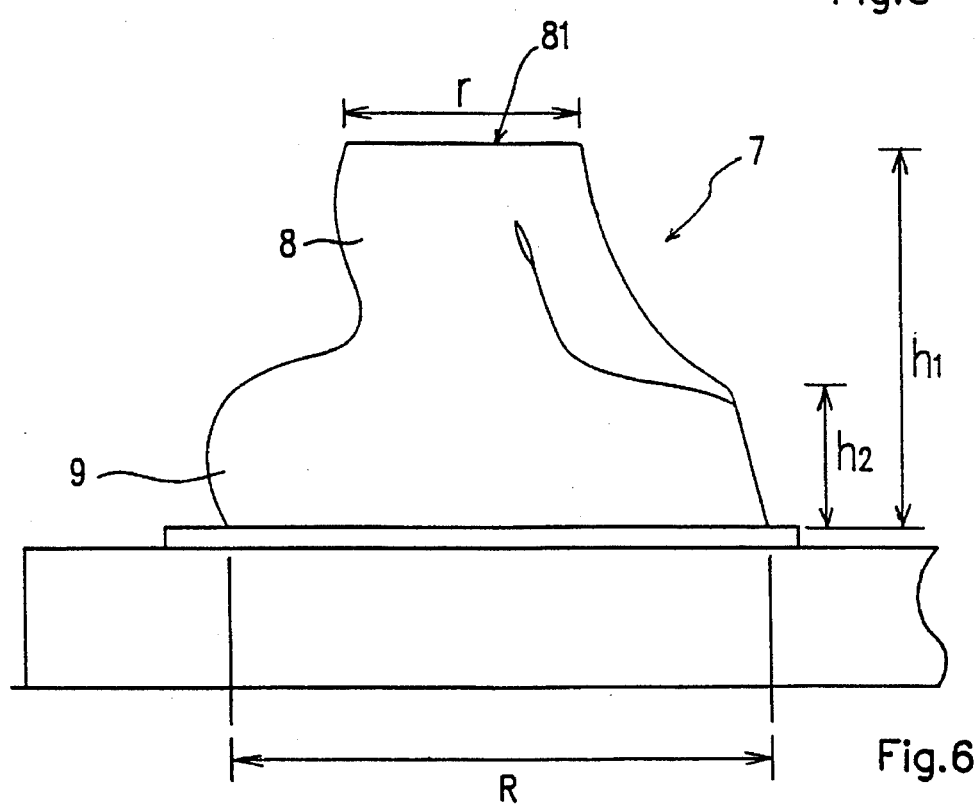
FIG. 6 shows a typical shape of a two-stage bump formed by a ball bonding method using the capillary of the first example.

FIG. 6 shows the shape of a typical two-stage bump formed by the ball bonding method according to this example. As to the two-stage bump 7 (stud bump), the outer diameter R is about 80 μm to 90 μm, the total height $h_1$ is about 40 μm to 50 μm, and the diameter r at the top 81 of the top portion 8 is about 40 μm to 50 μm. Also, the height $h_2$ of the pedestal portion 9 is about 15 μm to 25 μm. These values can be varied depending on the desired bonding pitch.

As described above, according to this example, the leveling of the bump 7 can be performed in the process of forming the bump 7. The time required for this process is substantially the same as that required for forming only the bump 107 in the prior art example. Therefore, the corresponding time compared to the conventional leveling process can be saved.

Figure 27A:
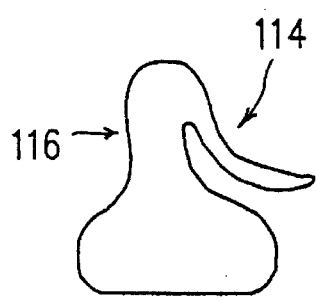
FIGS. 27A to 27C show undesirable shapes of two-stage bumps formed according to the conventional ball bonding method.
Figure 27B:
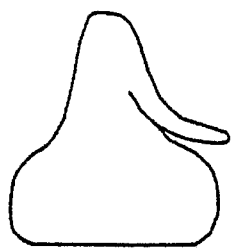
Figure 27C:
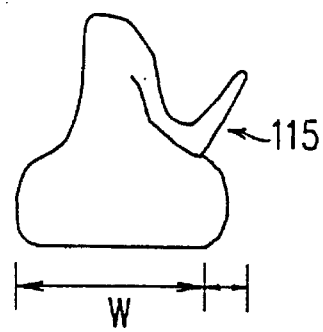

In addition, according to the bonding method of the invention, since the formation of the bump 7 and the pressing and shaping (leveling) of the bump 7 and the pressing and shaping (leveling) of the bump 7 are conducted in one process, almost no bumps 7 thus formed have the shapes shown in FIGS. 27A to 27C. More specifically, as is shown in FIG. 5, the capillary 1 presses the bump 7 until the tip face 11 thereof abuts against the electrode pad 13, so that the metal wire 4 which forms the tip portion 8 of the bump 7 can be cut more easily.

Figure 28A:
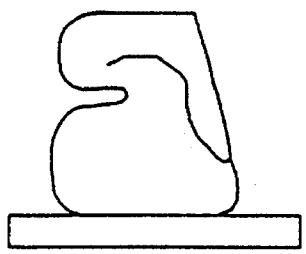
FIGs. 28A and 28B show shapes of defective bumps caused as the result of the conventional leveling process.
Figure 28B:
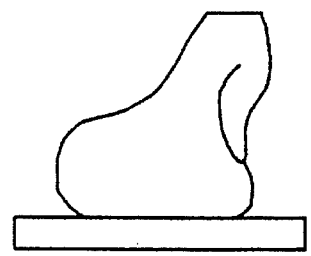

Furthermore, one side of the bump 7 is supported by a side face of the end portion of the capillary 1 in the leveling, so that the falling down of the top portion which occurs in the leveling as shown in FIG. 28B can be prevented.

As described above, according to the invention, it is possible to prevent the formation of bumps having undesired shapes (defective bumps) which cannot be improved by the conventional leveling process. Also, the bumps can be formed so as to have substantially uniform shapes, so that it is possible to more surely connect the semiconductor device to the circuit board.

Figures 7A, 7B, 7C:
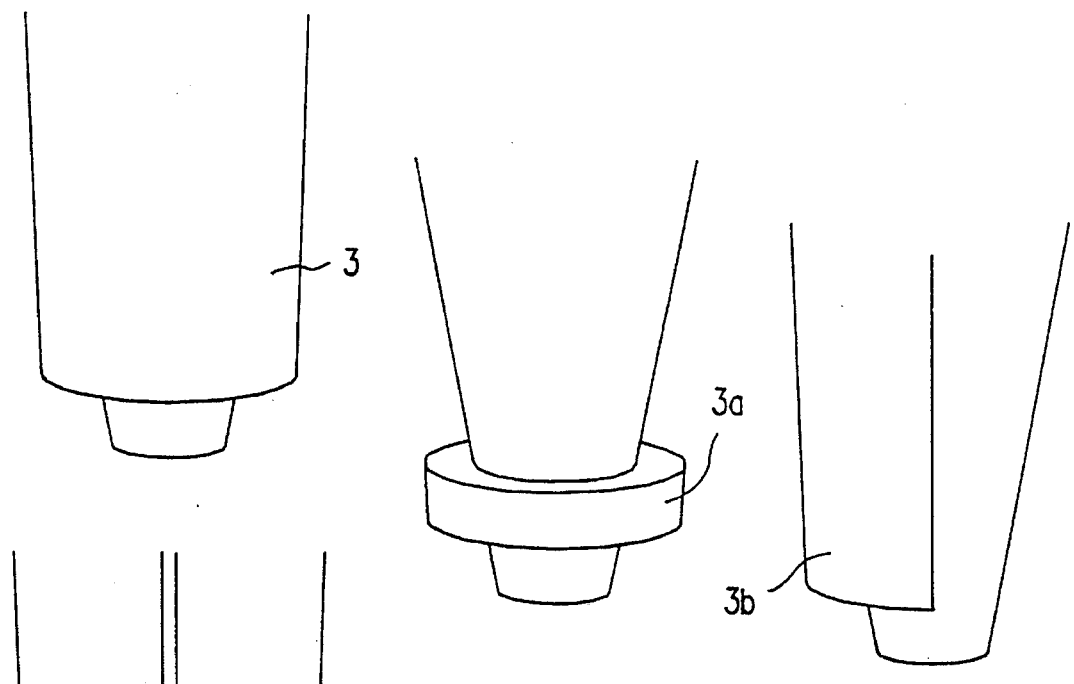
FIGs. 7A to 7C are diagrams showing possible shapes of a protrusion of the capillary of the invention.

In this example, the capillary 1 has a cylindrical shape, and the protrusion 3 also has a cylindrical shape so that the bottom face 31 is basically circular in view of the processibility for producing the capillary 1 (FIG. 7A). It is desirable that the bottom face 31 of the protrusion 3 be set parallel to the IC chip 6 in the leveling. As far as the protrusion 3 is projected from the outer circumference of the capillary 1 and is provided with a bottom face for leveling the bump 7, any other shape of protrusion is available. For example, a disk-like protrusion 3a shown in FIG. 7B can be used, and a protrusion 3b can be provided on one side of the capillary 1 as is shown in FIG. 7C.

Next, some exemplary semiconductor units in which the semiconductor device (IC chip) with the bump 7 is mounted on the circuit board are described. In the following examples, the shape of the two-stage bump 7 is schematically shown in the figures.

Figure 8:
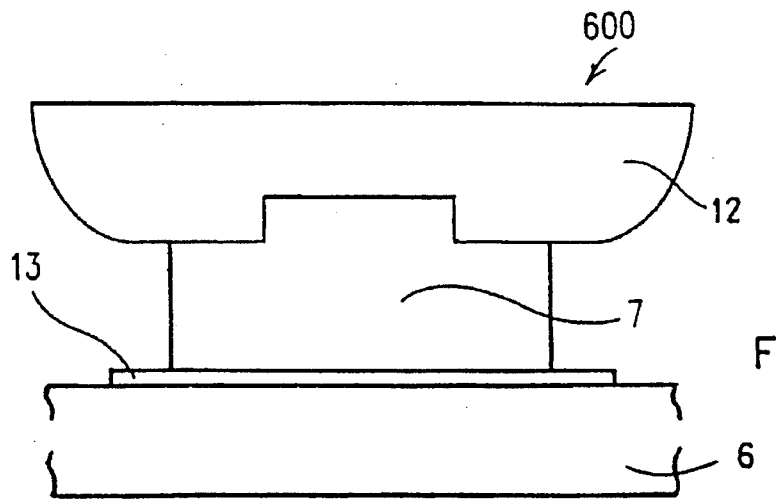
FIG. 8 is a diagram showing an example of a mounted semiconductor device (a semiconductor unit) with a two-stage bump formed according to the invention.

FIG. 8 shows a semiconductor unit 600 in which the semiconductor device having the bump 7 is mounted on a lead (terminal electrode) group 12 formed on a flexible resin film via the bump 7. In this example, the bump 7 is made of Au. The material of the lead group 12 may be a plating of Au or Sn having a foundation of Ni, or may be Al, Cu, or solder. After the position adjustment is performed in such a manner that the bump 7 and the lead group 12 are located at prescribed positions, a pressure is applied using a heated bonding tool so as to make the materials thereof into an alloy, or the thermo-compression bonding is performed. As a result, the bump 7 comes into electric contact with the lead group 12 formed on the flexible resin film. In the case of the thermo-compression bonding, the ultrasonic vibration can additionally be used. Alternatively, the compression bonding may be performed only by the ultrasonic vibration. The material of the lead group 12 may be a plating of Au or Sn having a foundation of Ni, or may be Al, Cu, or solder.

Figure 9A:
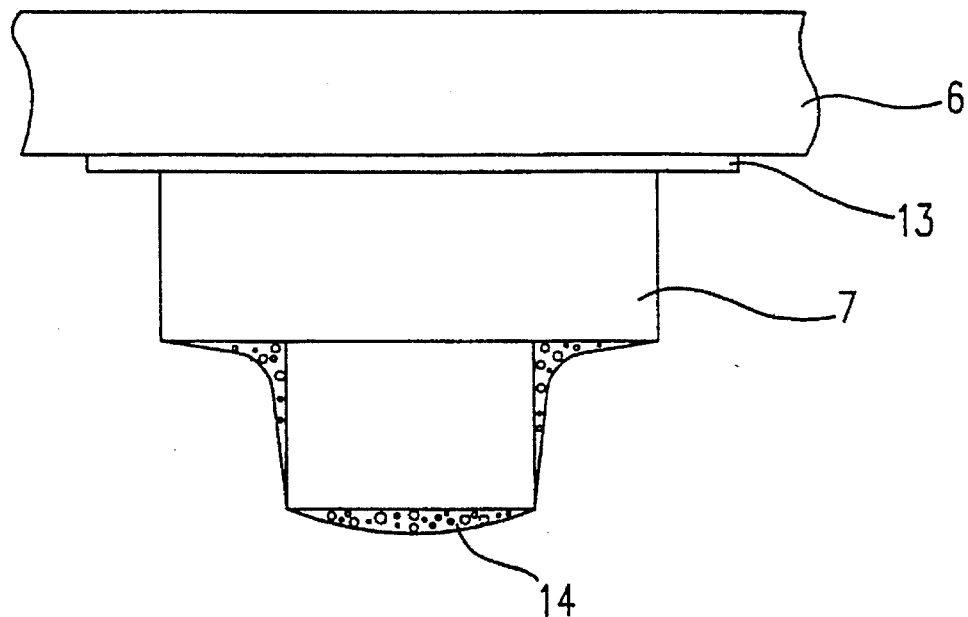
FIGs. 9A and 9B illustrate a method for bonding a semiconductor device having a two-stage bump formed according to the invention onto a circuit board with conductive adhesive, and show a semiconductor unit after the bonding.
Figure 9B:
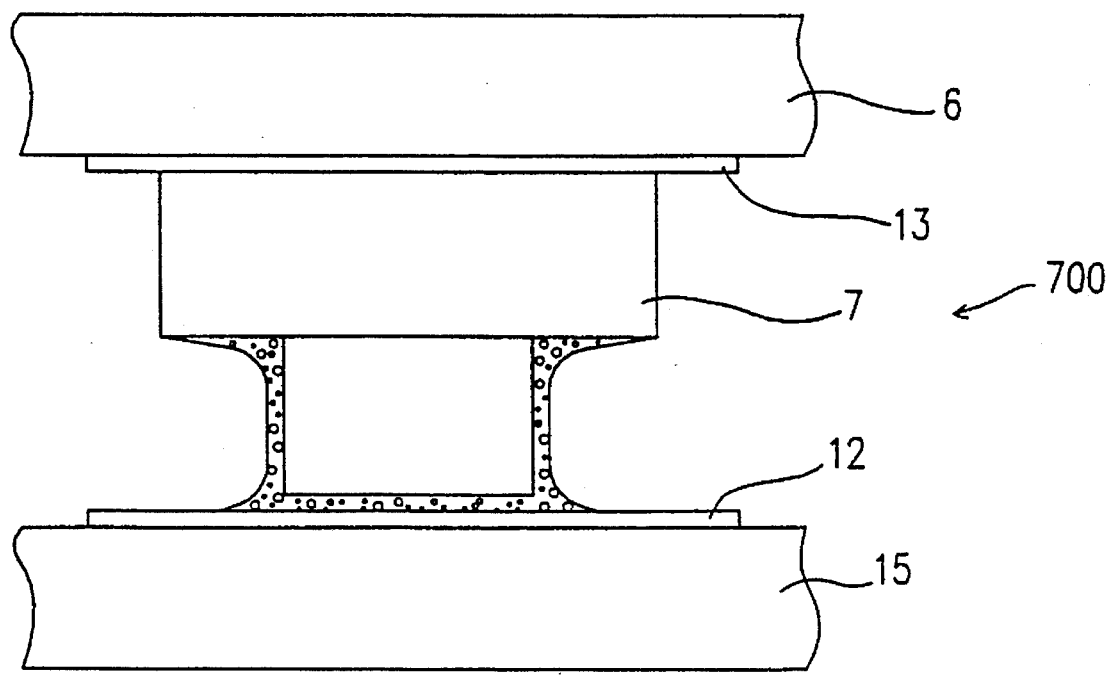

FIGS. 9A and 9B illustrate a method for bonding the bump 7 of the semiconductor device onto the terminal electrode 12 of the circuit board 15 with conductive adhesive 14, and show a semiconductor unit 700 obtained after the bonding. As is shown in FIG. 9A, the conductive adhesive 14 is applied to the top of the bump 7 of the semiconductor device by a transfer method or a printing method. By using the bump 7 having two-stage projected portions, an excess amount of conductive adhesive 14 is prevented from adhering to the bump 7. Thus, a suitable amount of conductive adhesive 14 can be applied to the bump 7. After the application of the conductive adhesive 14, as is shown in FIG. 9B, the semiconductor device is mounted facedown onto the circuit board 15. After the bump 7 is positioned in such a manner that the bump 7 abuts against a predetermined position of the terminal electrode 12 of the circuit board 15, the conductive adhesive 14 is thermally cured at a temperature in the range of 80° C. to 150° C, so as to form an adhesion layer. As a result, the bump 7 of the semiconductor device is electrically connected to the terminal electrode 12 on the circuit board 15. Thus, the semiconductor device is mounted on the circuit board.

According to this example, the formation of defective bumps including the second peeling and tail standing can be prevented, and the conductive adhesive cannot be held and spread by the peeled portion or the tail portion. This means that there is little probability of a short-circuit with adjacent bumps or electrodes. Therefore, it is possible to connect the semiconductor device to the circuit board with high reliability.

Figure 10A:
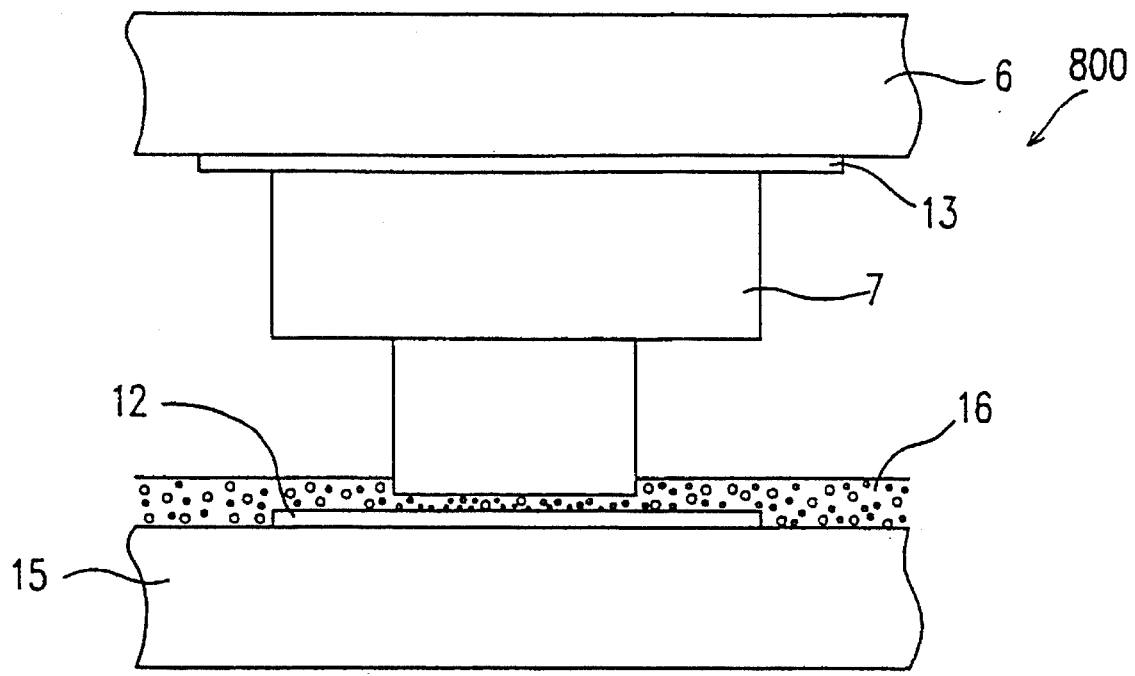
FIGS. 10A and 10B show semiconductor units in which a semiconductor device having a two-stage bump formed according to the invention is electrically connected onto a circuit board with an anisotropic conductive member.
Figure 10B:
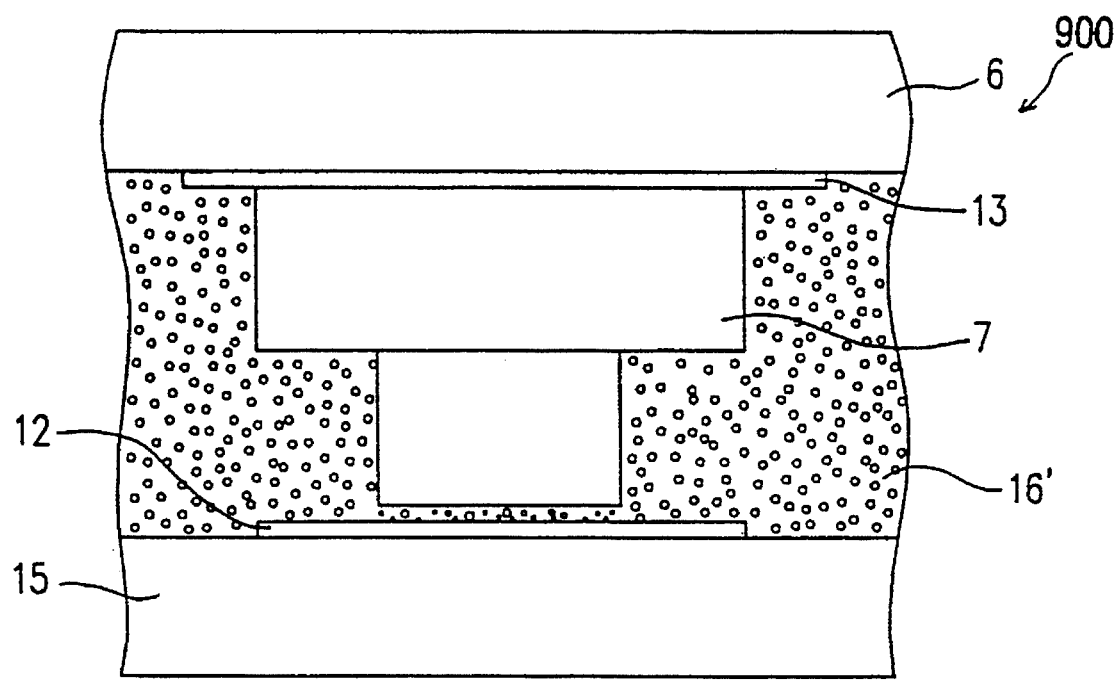

FIGS. 10A and 10B show a semiconductor unit in which the semiconductor device is electrically connected to the terminal electrode 12 of the circuit board 15 with an anisotropic conductive member.

As is shown in FIG. 10A, in a semiconductor unit 800, a thin anisotropic conductive member 16 is disposed on the terminal electrode 12 formed on the circuit board 15. The semiconductor device with the bump 7 is located facedown thereon. By pressing the semiconductor device against the circuit board 15 with heating, a portion of the anisotropic conductive member 16 sandwiched between the bump 7 and the terminal electrode 12 is thermo-compressed and bonded. Thus, the electric connection can be obtained.

In the thermo-compressed portion of the anisotropic conductive member 16, conductive particles included in the anisotropic conductive member 16 are pressed by the bump 7, and bonded to each other. Also, the conductive particles are sunk into the surface of the terminal electrode 12, so that the bump 7 and the terminal electrode 12 are electrically connected to each other. In the remaining portion which are not compressed, the conductive particles exist separately from each other, so that the electric insulation is maintained.

FIG. 10B shows a semiconductor unit 900 which utilizes an anisotropic conductive member 16' with a thickness larger than the total thickness of the bump 7 and the terminal electrode 12. The thick anisotropic conductive member 16' is disposed on the terminal electrode 12 formed on the circuit board 15. Then, the semiconductor device with the bump 7 is located facedown thereon. By pressing the semiconductor device against the circuit board 15 with heating, a portion of the anisotropic conductive member 16' sandwiched between the bump 7 and the terminal electrode 12 is compressed. Thus, the electric connection can be obtained. Also in this case, only the portion sandwiched between the bump 7 and the terminal electrode 12 is compressed, and the remaining portion maintains the electric insulation. The remaining portion of the anisotropic conductive member 16' functions as insulating adhesive. When the resin is thermally cured, the semiconductor is bonded to the circuit board.

Example 2

Figure 11:
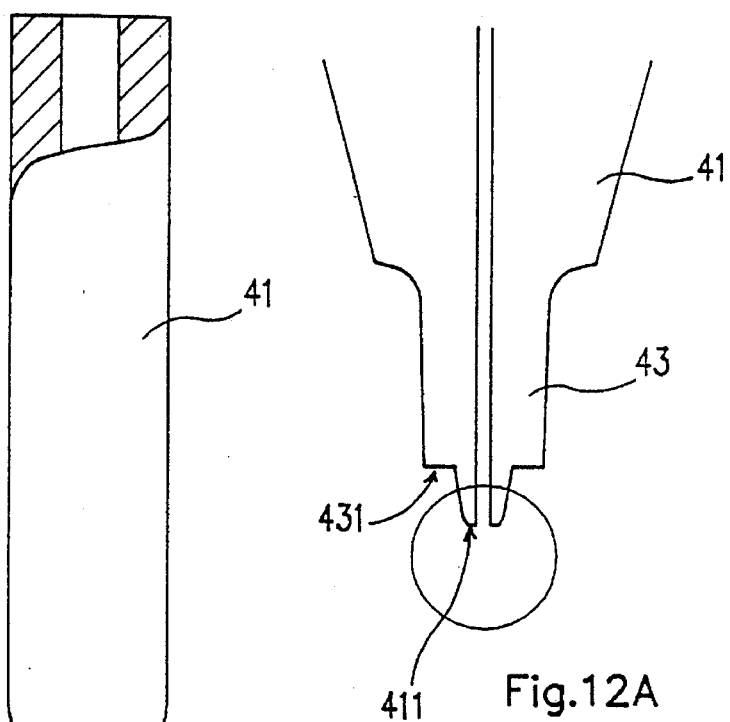
FIG. 11 is a diagram showing a capillary for ball bonding in a second example according to the invention.
Figure 12A:
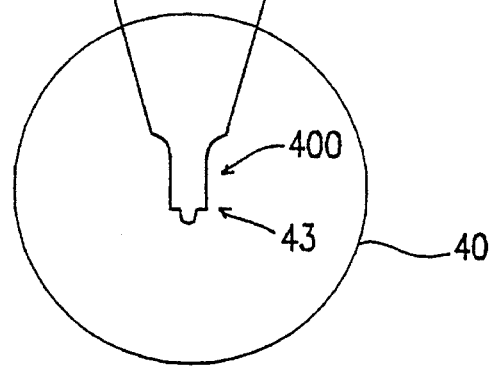
FIG. 12A is a schematic cross-sectional view of an end portion of a capillary shown in FIG. 11.
Figure 12B:
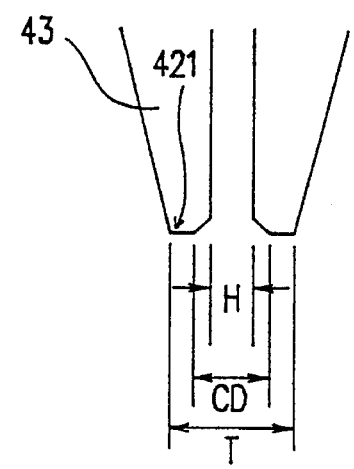
FIG. 12B is a diagram showing the shape of the end portion of the capillary in detail.

FIG. 11 shows a capillary 41 for ball bonding in a second example according to the invention. FIG. 12A is a schematic cross-sectional view of an end portion 40 of the capillary 41. FIG. 12B shows the shape of the end portion 40 of the capillary 41 in more detail. In order to form bumps with a finer bonding pitch, the capillary 41 is provided with a bottleneck 400 having a tapered end. The height of the bottleneck is generally about 500 μm. In FIG. 12A, the height is set to be 460 μm.

As is shown in FIG. 11, the cylindrical capillary 41 has a protrusion 43 as a leveling member provided on an outer circumference of the bottleneck 400. The capillary 41 is made of ceramic or artificial ruby. As is shown in FIG. 12A, the bottom face 431 (a leveling plane) of the protrusion 43 is substantially parallel to the tip face 411 of the capillary 41. The height measured from the tip face 411 of the capillary 41 to the bottom face 431 is set to a predetermined value d. In the capillary 41, there is provided a bore 2 into which a metal wire for bonding is inserted, the same as in the capillary 1. The diameter of the bore 2 is in the range of about 25 μm to 50 μm. The end portion of the capillary 41 (the bottleneck 400) has a cone shape with an angle of about 10°, in view of the bonding pitch, and the shape and size of the metal wire (or a bump) after the bonding.

FIG. 12B, for example, shows the shape of the end portion of the capillary 41 when a metal wire having a diameter of about 25 μm is used. In this case, the bore diameter (hole diameter) H is 38 μm, the tip diameter T is 152 μm, and the chamfer diameter CD is 64 μm.

The above-described capillary 41 is, for example, attached to a bonder 500 shown in FIG. 3, the same as in the case of the capillary 1. The method of forming the two-stage bump 7 using the capillary 41 is the same as the method described in the first example.

As described above, according to the second example, as in the first example, the formation and the leveling of the bump 7 can be performed in one and the same process even in the case of the finer bonding pitch, without adding another leveling process.

According to the second example, it is possible to prevent the formation of bumps having undesired shapes (defective bumps) which cannot be improved by the conventional leveling process. Also, the bumps can be formed to have uniform shapes, so that it is possible to more surely connect the semiconductor device to the circuit board.

Example 3

Figure 13:
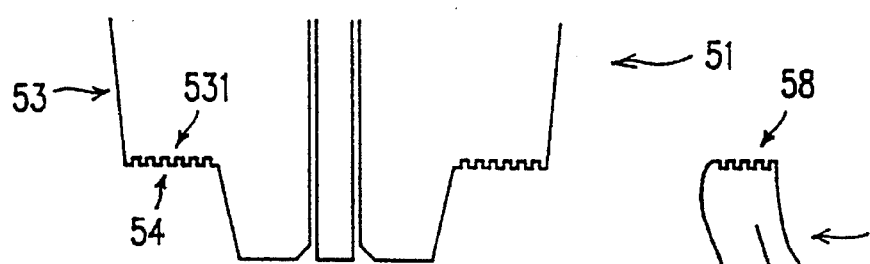
FIG. 13 is a cross-sectional view of an end portion of a capillary for ball bonding in a third example according to the invention.

FIG. 13 is a cross-sectional view of the end portion of a capillary 51 for ball bonding in a third example of the invention. In the third example, as is shown in FIG. 13, the cylindrical capillary 51 has a protrusion 53 provided on the outer circumference of the end portion thereof. A bottom face (a leveling plane) 531 of the protrusion 53 includes a rugged side 54. Herein, the term "rugged side" means a side having a surface which is roughened by forming a number of grooves of a width of 0.1 μm to 10 μm in various directions. The other portions of the capillary 51 can be formed in the same manner as in the capillary 1 or the capillary 41, depending on the required bonding pitch.

Figure 14:
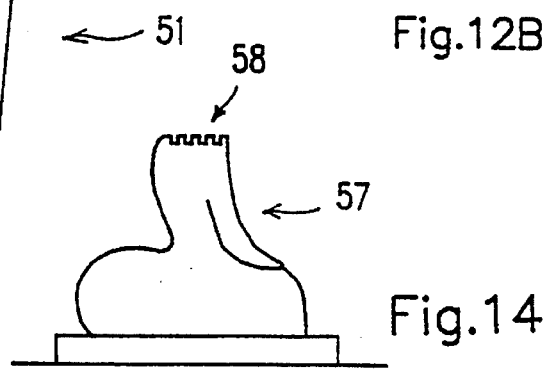
FIG. 14 shows a shape of a two-stage bump formed using the capillary of the third example.

The method of forming the two-stage bump using the capillary 51 is the same as that described in the first example. In this example, in the second bonding in which a bump 57 is pressed and shaped by the bottom face 531 of the protrusion 53 provided on the outer circumference of the capillary 51, a rugged side 58 is formed at the top of the bump 57 by the rugged side 54 on the bottom face 531. In the second bonding, in order to effectively form the rugged face 58, the ultrasonic vibration is applied. The two-stage bump 57 formed using the capillary 51 is shown in FIG. 14.

Figure 15A:
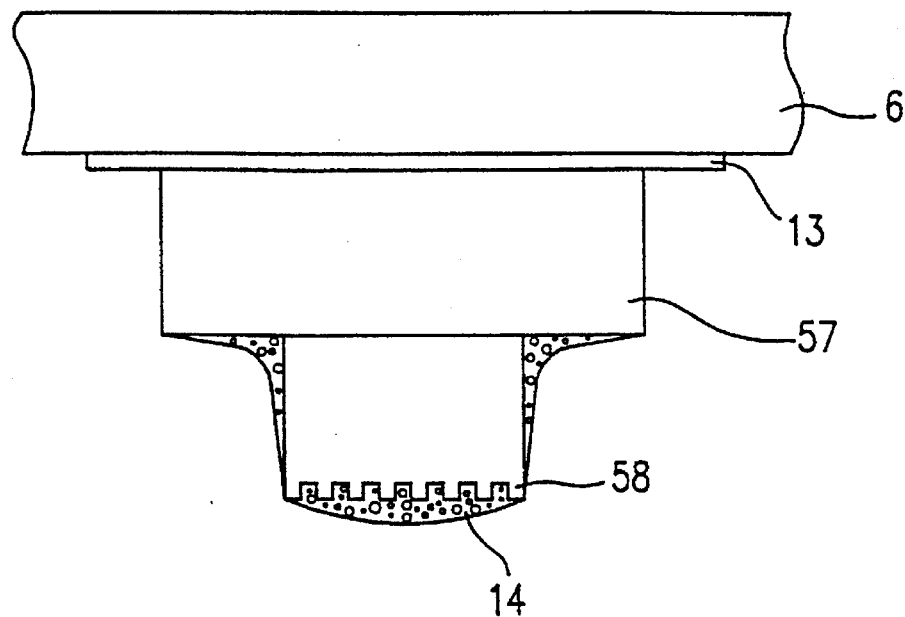
FIGS. 15A and 15B illustrate a method for bonding a semiconductor device having a two-stage bump formed according to the invention onto a circuit board with conductive adhesive, and show a semiconductor unit obtained after the bonding.
Figure 15B:
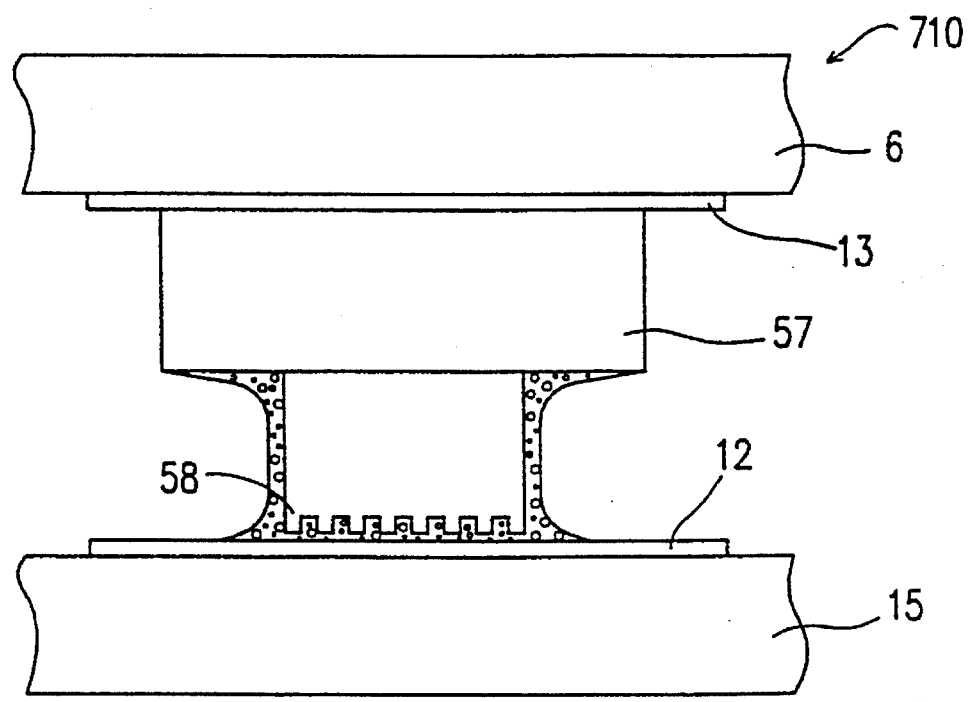

FIGS. 15A and 15B illustrate a method for bonding the bump 57 of the semiconductor device onto a terminal electrode 12 formed on a circuit board 15 with conductive adhesive 14, and show a semiconductor unit 710 obtained after the bonding. The adhering method is the same as that described in the first example with reference to FIGS. 10A and 10B.

By using the bump 57 having a two-stage projecting shape, an excess amount of conductive adhesive 14 is prevented from adhering to the bump 57. Thus, a suitable amount of conductive adhesive 14 can be applied to the bump 57. In this example, since the rugged side 58 is formed at the top of the bump 57, the adhering area of the conductive adhesive 14 can be increased. In addition, conductive particles of the conductive adhesive 14 get into the grooves of the rugged side 58, so that the electric conductivity can be more surely attained. Therefore, a semiconductor unit with higher reliability can be obtained.

Figure 16A:
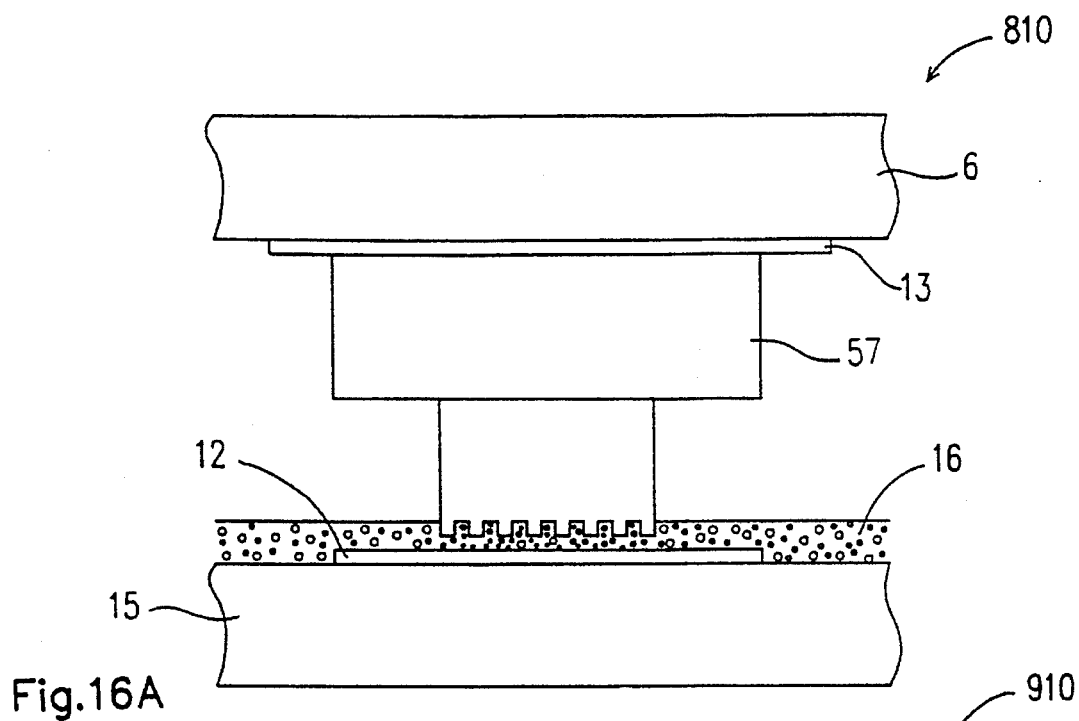
FIGs. 16A and 16B show semiconductor units in which a semiconductor device having a two-stage bump formed according to the invention is electrically connected onto a circuit board with an anisotropic conductive member.
Figure 16B:
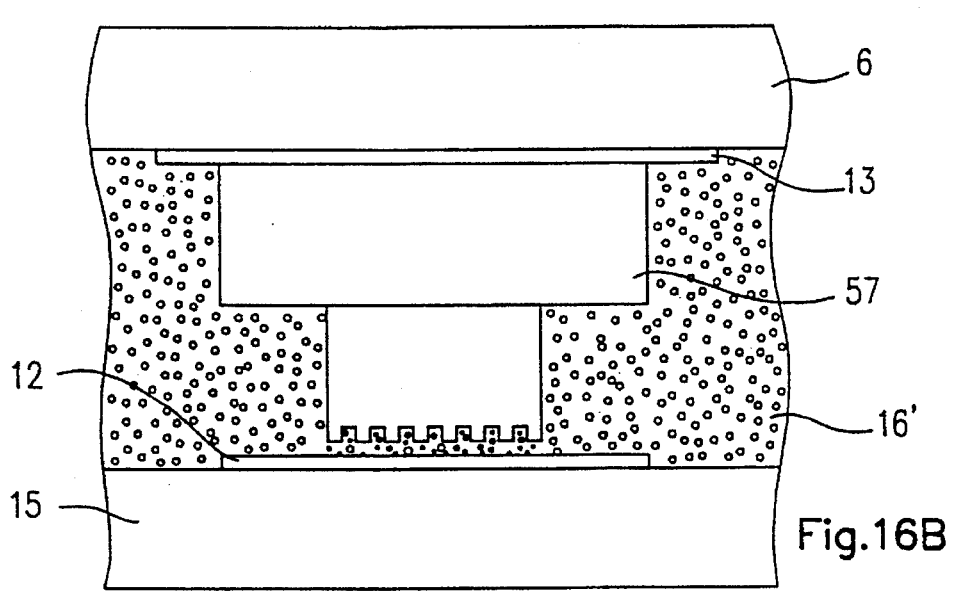

FIGS. 16A and 16B show semiconductor units 810 and 910, respectively, in which the semiconductor device is electrically connected onto the terminal electrode 12 of the circuit board 15 with an anisotropic conductive member.

The semiconductor units 810 and 910 are mounted in the same way as in the semiconductor units 800 and 900 described in the first example. In the semiconductor units 810 and 910, since the rugged side 58 is formed at the top of the bump 57, the surface area of the bump 57 which is in contact with the conductive particles is increased. Thus, a good electric contact can be attained. In addition, the formation of the rugged side 58 increased the surface area of the bump 57 in contact with the conductive particles of the anisotropic conductive member 16 or 16' and the adhering area of the resin. Accordingly, the conductivity and the adhesion strength are increased, so that an electric connection with higher reliability can be attained.

The size of each conductive particle in the anisotropic conductive member is in the range of about 1 μm to 10 μm. In order to effectively attain the electric contact, it is necessary to appropriately select the degree of roughness of the rugged side formed at the top of the bump and the size of the conductive particle.

In FIG. 13, the rugged side 54 is provided over the entire bottom face 531 of the protrusion 53. Alternatively, the rugged side 54 may be provided in a desired portion of the bottom face 531. In this example, the capillary 51 has a cylindrical shape, and the protrusion 53 also has a cylindrical shape so that the bottom face 531 is basically circular in view of the processibility for producing the capillary 51. As far as the protrusion 53 is projected from the outer circumference of the capillary 51 and is provided with a bottom face for leveling the bump 57 and the rugged side, any other shape of protrusion is available as described in the first example. However, it is desirable that the bottom face 531 of the protrusion 53 be set parallel to the IC chip 6 in the leveling.

Example 4

Figure 17:
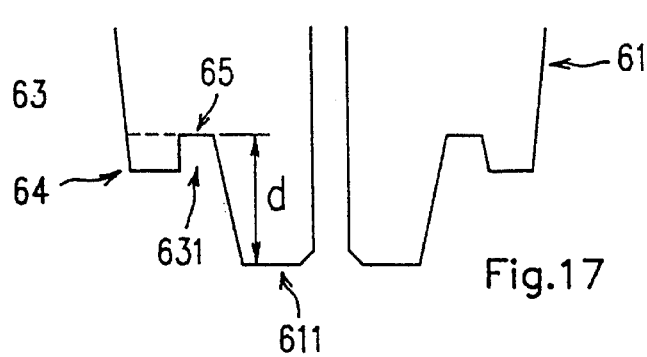
FIG. 17 is a cross-sectional view showing an end portion of a capillary for ball bonding in a fourth example according to the invention.

FIG. 17 is a cross-sectional view of the end portion of a capillary 61 for ball bonding in a fourth example of the invention. In the fourth example, as is shown in FIG. 17, the cylindrical capillary 61 has a protrusion 63 provided on an outer circumference of the end portion. A bottom face 631 of the protrusion 63 includes a leveling plane 65 and a guiding portion 64. As is shown in FIG. 17, the leveling plane 65 of the protrusion 63 is substantially parallel to the tip face 611 of the capillary 61. The height measured from the tip face 611 of the capillary 61 to the leveling plane 65 is set to be predetermined value d. The value d of the height is set depending on the bump height to be formed.

Figure 18A:
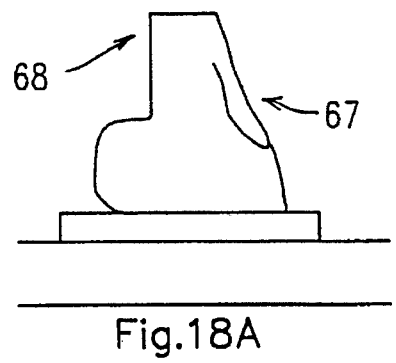
FIG. 18A shows a two-stage bump formed by the capillary in the fourth example.
Figure 18B:
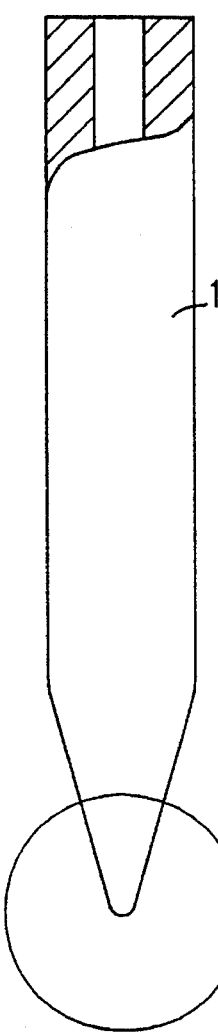
FIG. 18B shows a shape of a two-stage bump with the tip portion thereof fallen.
Figure 19:
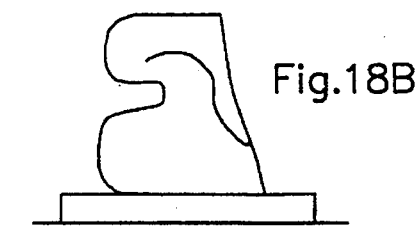
FIG. 19 is a diagram showing an exemplary conventional capillary for a wire bonding apparatus.
Figure 21:
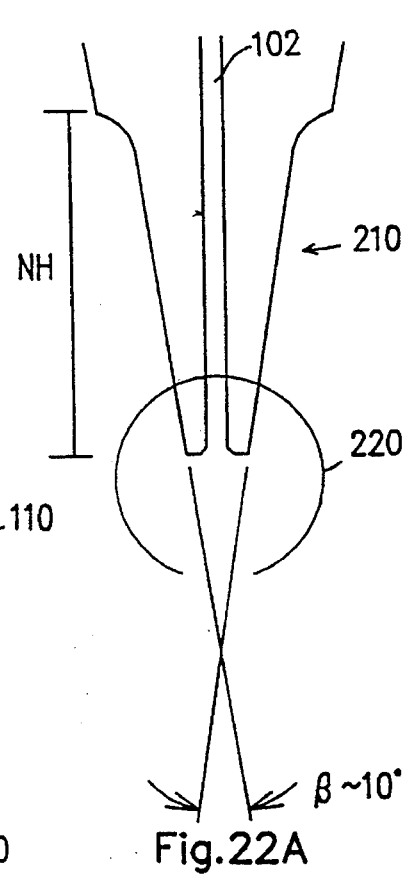
FIG. 21 is a diagram showing another exemplary conventional capillary for a wire bonding apparatus.
Figure 20A:
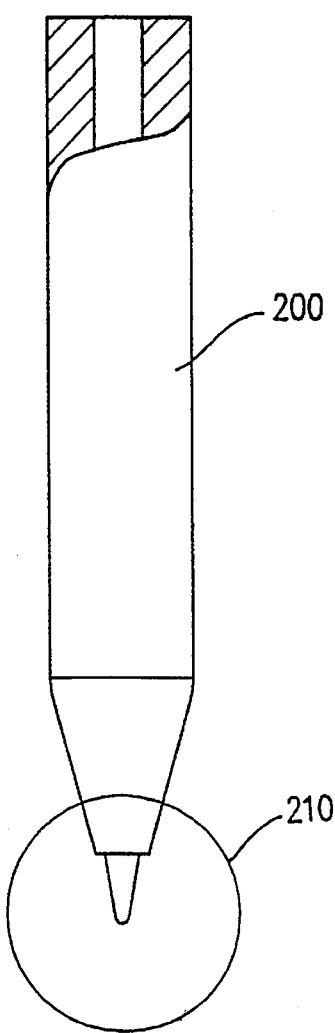
FIG. 20A is a schematic cross-sectional view showing an end portion of the capillary shown in FIG. 19.
Figure 20B:
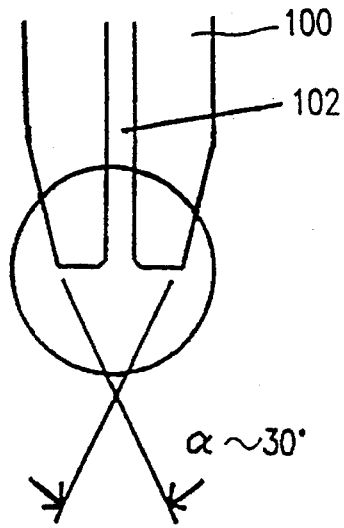
FIG. 20B is a diagram showing the shape of the end portion of the capillary in detail.
Figure 22A:
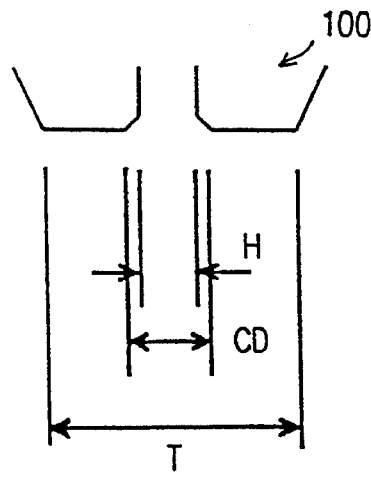
FIG. 22A is a schematic cross-sectional view showing an end portion of the capillary shown in FIG. 21.
Figure 22B:
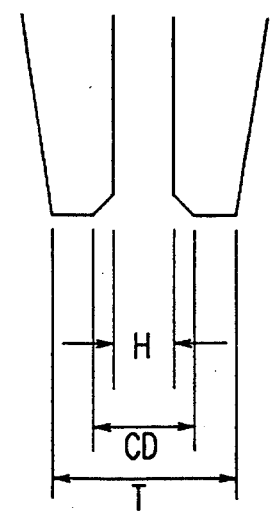
FIG. 22B is a diagram showing the shape of the end portion of the capillary in detail.
Figure 23A:
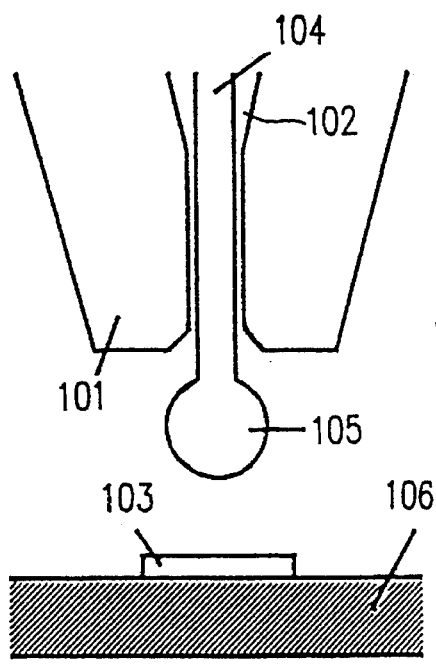
FIGS. 23A to 23D are diagrams schematically illustrating a method of forming a two-stage bump by a ball bonding method using a conventional capillary.
Figure 23B:
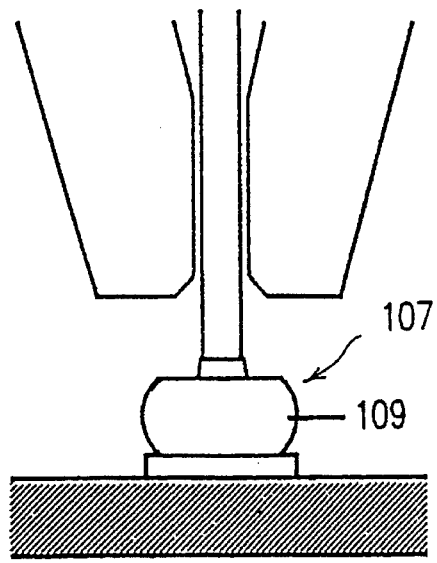
Figure 23C:
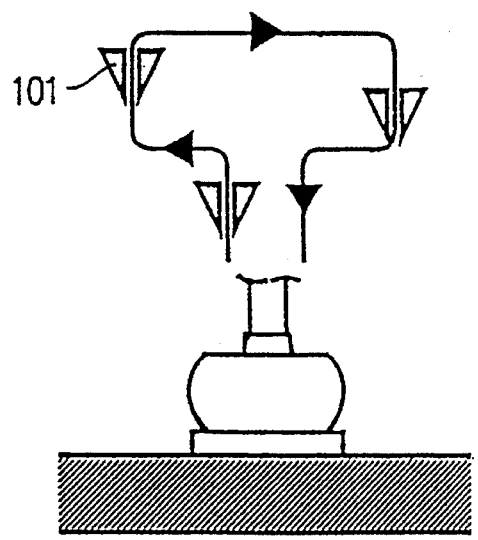
Figure 23D:
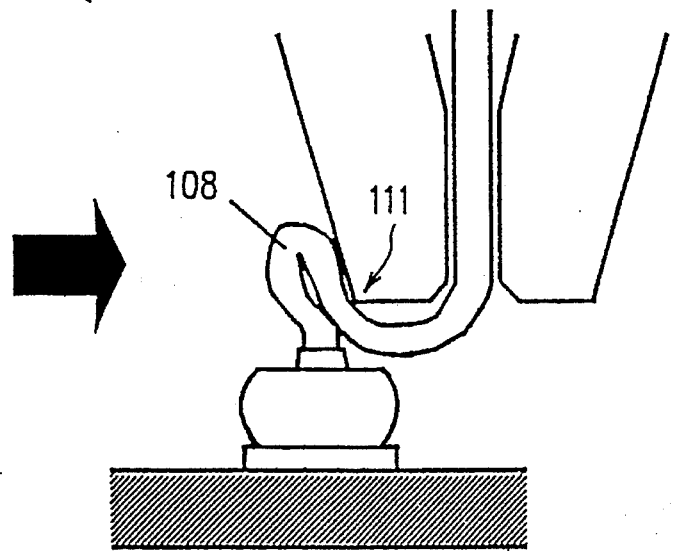
Figure 24:
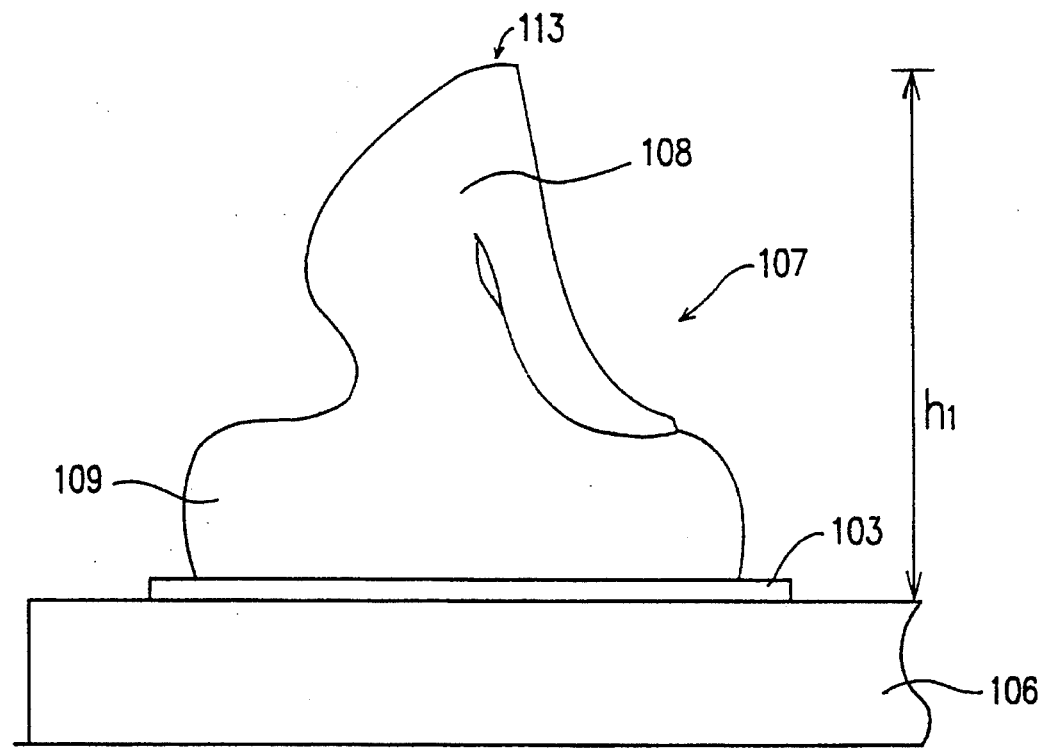
FIG. 24 is a diagram showing a shape of a typical two-stage bump formed according to a conventional ball bonding method.
Figure 25:
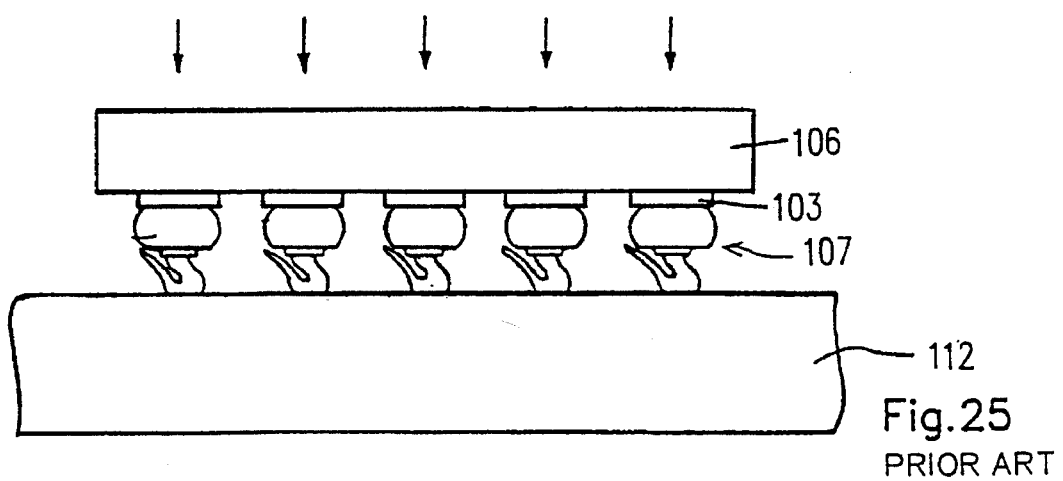
FIG. 25 is a diagram illustrating a leveling process according to the conventional ball bonding method.
Figure 26:
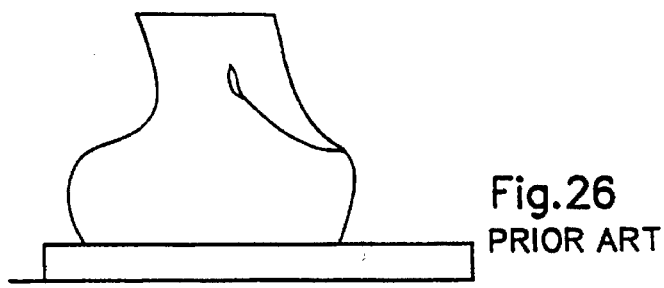
FIG. 26 is a diagram showing a typical shape of a bump after the leveling process according to the conventional ball bonding method.

The guiding portion 64 is a portion projected vertically (downwards) and provided along the outer periphery of the bottom face 631. The guiding portion 64 holds a top portion 68 of the two-stage bump 67 in the second bonding (leveling), so as to prevent the top portion 68 of the two-stage bump 67 from falling down as is shown in FIG. 18B. The two-stage bump 67 formed using the capillary 61 is shown in FIG. 18A.

The shape of the guiding portion 64 is not limited to any particular shape, as far as the two-stage bump 67 thus formed has a shape with which the bump 67 can keep a sufficient amount of the transferred conductive adhesive. For example, the top portion 68 may be formed so that a side face of the top portion 68 is vertical.

The other portions of the capillary 61 are the same as those in the capillary 1 or the capillary 41, depending on the desired bonding pitch.

The method of forming the two-stage bump 67 using the capillary 61 is the same as the method described in the first example. In this example, the bump 67 is pressed and shaped by the leveling plane 65 of the bottom face 631 of the protrusion 63 provided on the outer circumference of the capillary 61 in the second bonding, and the top portion 68 of the bump 67 is supported by the guiding portion 64 formed along the outer periphery of the bottom face 631 in the second bonding. Accordingly, the falling down of the top portion 68 of the two-stage bump 67 can be prevented, and defective bumps such as those shown in FIGS. 28A and 28B which occur in the conventional leveling process can be prevented.

In addition, by the provision of the guiding portion 64, the top portions 68 can have substantially equal areas. Thus, it is possible to form bumps 67 in uniform shapes with reduced variation.

In FIG. 17, the guiding portion 64 is provided on the entire outer peripheral portion of the bottom face 631. Alternatively, the guiding portion 64 may be provided on a desired portion of the outer peripheral portion of the bottom face 631. In this example, the capillary 61 has a cylindrical shape, and the protrusion 63 also has a cylindrical shape so that the bottom face 631 is basically circular in view of the processibility for producing the capillary 61. As far as the protrusion 63 is projected from the outer circumference of the capillary 61 and is provided with a leveling plane for leveling the bump 67 and a guiding portion for supporting the top portion 68 of the bump 67, any other shape of protrusion is available as described in the first example. It is desirable that the leveling plane 65 of the protrusion 63 be set parallel to the IC chip 6 in the leveling.

As is understood from the above description, according to the invention, the leveling of bumps can be performed in the formation process of the bumps of the semiconductor device, so that it is possible to obtain bumps with a desired height and a desired shape without adding another leveling process. Therefore, not only the time and cost required for adding another leveling process are saved, but it is possible to form leveled bumps for easily connecting the semiconductor device to a circuit board with high reliability. Furthermore, according to the invention, the formation of bumps having undesired shapes can be prevented, and it is possible to form bumps having uniform shapes with much reduced variation.

Accordingly, the semiconductor device and the circuit board can be positively electrically connected and bonded to each other, so that it is possible to perform a stable and reliable mounting of the semiconductor device. The number of production processes and the production costs are both reduced, and the effects of the invention are equal to or greater than those of the prior art, so that the versatility for the practical use is extremely high.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A capillary for ball bonding for forming a bump on an electrode pad of a semiconductor device, said capillary comprising:

a pressing member including a tip face for pressing a ball-like end of a metal wire against said electrode pad to secure said ball-like end to said electrode pad under pressure;

a bore, provided in said pressing member, for supplying said metal wire; and a leveling member for making said bump formed on said electrode pad a predetermined height, said leveling member including a bottom face for pressing said bump, wherein said bottom face is positioned a predetermined distance from said tip face to define the predetermined height of said bump.

2. A capillary according to claim 1, wherein said leveling member is a protrusion projected from an outer circumference of said capillary.

3. A capillary according to claim 1, wherein said leveling member is provided along an outer circumference of said capillary.

4. A capillary according to claim 1, wherein said leveling member is provided in a portion of an outer circumference of said capillary.

5. A capillary according to claim 1, wherein said leveling member includes a guiding portion adjacent to said bottom face, said guiding portion being projected downwards from said bottom face.

6. A capillary according to claim 1, wherein said pressing member has an edge for cutting said metal wire.

7. A capillary according to claim 1, wherein said capillary is made of a material selected from the group consisting of ceramic and artificial ruby.

8. A capillary according to claim 1, wherein said bottom face is substantially parallel to a stage of a bonding apparatus to which said capillary is attached.

9. A capillary for ball bonding for forming a bump on an electrode pad of a semiconductor device, said capillary comprising:

a pressing member including a tip face for pressing a ball-like end of a metal wire against said electrode pad to secure said ball-like end to said electrode pad under pressure;

a bore, provided in said pressing member, for supplying said metal wire; and a leveling member for making said bump formed on said electrode pad a predetermined height, said leveling member including a bottom face for pressing said bump, wherein said bottom face has a rugged side.

10. A method of forming a bump on an electrode pad of a semiconductor device using a capillary for ball bonding comprising: a pressing member including a tip face of said capillary; a bore, provided in said pressing member, for supplying said metal wire; and a leveling member provided on an outer circumference of said capillary, said method comprising the steps of:

(a) forming a ball at an end of said metal wire supplied from said bore;

(b) forming a first portion of said bump by moving said capillary downwards and by securing said ball-like end to said electrode pad under pressure by said pressing member;

(c) forming a second portion of said bump on said first portion by supplying said metal wire while said capillary is moved; and (d) when said capillary is moved downwards, cutting a portion of said metal wire constituting said second portion from the remaining portion of said metal wire in said bore by an edge of said pressing member, and simultaneously leveling said bump by said leveling member.

11. A method according to claim 10, wherein in said step (c), said capillary is moved in a loop above said first portion, and said portion of said metal wire constituting said second portion of said bump is formed in a ring-shape or a reversed U-shape on said first portion.

12. A method according to claim 10, wherein said leveling member includes a bottom face positioned at a predetermined height measured from said tip face, and in said step (d), said bump is formed to have said predetermined height by pressing said bump by said bottom face.

13. A method according to claim 12, wherein in said step (d), said capillary is moved downwards until said tip face abuts against said electrode pad.

14. A method according to claim 12, wherein said bottom face has a rugged side, and in said step (d), said second portion of said bump is formed to have a rugged top face.

15. A method according to claim 12, wherein said leveling member includes a guiding portion adjacent to said bottom face, said guiding portion being projected downwards from said bottom face, and in said step (d), said second portion of said bump is supported by said guiding portion.

16. A method according to claim 10, wherein in said step (b), said first portion is formed by thermo-compression bonding.

17. A method according to claim 10, wherein in said step (b), said first portion is formed by ultrasonic vibration.

18. A method according to claim 10, wherein in said step (b), said first portion is formed by a combination of thermo-compression bonding and ultrasonic vibration.

19. A method according to claim 10, wherein said metal wire is made of a material selected from the group consisting of Au, Cu, Al, and solder.

* * * * *